(12) United States Patent
Walker et al.

(10) Patent No.: US 10,534,682 B2
(45) Date of Patent: Jan. 14, 2020

(54) METHOD AND DIAGNOSTIC APPARATUS FOR PERFORMING DIAGNOSTIC OPERATIONS UPON A TARGET APPARATUS USING TRANSFERRED STATE AND EMULATED OPERATION OF A TRANSACTION MASTER

(71) Applicant: ARM Limited, Cambridge (GB)

(72) Inventors: Robert John Walker, Blackburn with Darwen (GB); Anthony Russell Armitstead, Blackburn with Darwen (GB)

(73) Assignee: ARM Limited, Cambridge (GB)

( * ) Notice: Subject to any disclaimer, the term of this patent is extended or adjusted under 35 U.S.C. 154(b) by 389 days.

(21) Appl. No.: 15/392,100

(22) Filed: Dec. 28, 2016

(65) Prior Publication Data

US 2018/0181478 A1    Jun. 28, 2018

(51) Int. Cl.
*G06F 11/36*      (2006.01)
*G06F 11/32*      (2006.01)
(Continued)

(52) U.S. Cl.
CPC .......... *G06F 11/321* (2013.01); *G06F 11/261* (2013.01); *G06F 11/3037* (2013.01); *G06F 11/3457* (2013.01); *G06F 11/3632* (2013.01); *G06F 11/3648* (2013.01); *G06F 13/364* (2013.01); *G01R 31/31705* (2013.01); *G01R 31/31712* (2013.01); *G06F 11/3636* (2013.01);
(Continued)

(58) Field of Classification Search
CPC ............... G06F 11/362; G06F 11/3636; G06F 11/3644; G06F 11/3632; G06F 11/3648; G06F 11/3652; G06F 11/3656; G06F 11/3664; G01R 31/31705; G01R 31/31712
See application file for complete search history.

(56) References Cited

U.S. PATENT DOCUMENTS

| | | | | |
|---|---|---|---|---|
| 5,530,804 A | * | 6/1996 | Edgington | .......... G06F 11/2236 703/28 |
| 5,978,584 A | * | 11/1999 | Nishibata | ............ G06F 11/3664 703/23 |

(Continued)

*Primary Examiner* — Joseph O Schell
(74) *Attorney, Agent, or Firm* — Nixon & Vanderhye P.C.

(57) ABSTRACT

Diagnostic operations upon a target apparatus 2 having a target transaction master 8 which initiates memory transactions with one or more target transaction slaves 12, 14, 16 are provided by halting operation of the target transaction master 8 while permitting continued operation within the target apparatus 2 of at least some of the target transaction slaves 12, 14, 16. Opening state data representing an operating state of the target transaction master 8 is transferred to a model transaction master 32. Further operation of the target transaction master 8 is emulated using the model transaction master 32 using the opening state data. Diagnostic operations are performed upon the model transaction master 32. When the model transaction master 32 emulates initiation of a memory transaction with a memory address mapped to one of the target transaction slaves 12, 14, 16, this initiates the memory transaction to be performed with the target apparatus 2. Pages of stored values from the memory address space of the target apparatus 2 may be cached within the emulation.

20 Claims, 7 Drawing Sheets

(51) Int. Cl.
*G06F 11/26* (2006.01)
*G06F 11/30* (2006.01)
*G06F 11/34* (2006.01)
*G06F 13/364* (2006.01)
*G01R 31/317* (2006.01)

(52) U.S. Cl.
CPC ...... *G06F 11/3652* (2013.01); *G06F 11/3656* (2013.01); *G06F 11/3664* (2013.01)

(56) References Cited

U.S. PATENT DOCUMENTS

| | | | | |
|---|---|---|---|---|
| 6,848,097 | B1* | 1/2005 | Alverson | G06F 11/362 714/E11.21 |
| 7,080,283 | B1* | 7/2006 | Songer | G06F 11/3636 714/30 |
| 7,711,990 | B1* | 5/2010 | Nickolls | G06F 11/3648 714/37 |
| 2006/0059286 | A1* | 3/2006 | Bertone | G06F 9/30014 710/260 |
| 2009/0287468 | A1* | 11/2009 | Lin | G06F 11/261 703/28 |
| 2013/0110490 | A1* | 5/2013 | Letz | G06F 11/2242 703/21 |
| 2013/0212425 | A1* | 8/2013 | Blaine | G06F 11/3648 714/6.1 |
| 2016/0139201 | A1* | 5/2016 | Lin | G01R 31/3177 714/727 |

* cited by examiner

METHOD AND DIAGNOSTIC APPARATUS FOR PERFORMING DIAGNOSTIC OPERATIONS UPON A TARGET APPARATUS USING TRANSFERRED STATE AND EMULATED OPERATION OF A TRANSACTION MASTER

BACKGROUND

Field

This disclosure relates to the field of data processing systems. More particularly, this disclosure relates to performing diagnostic operations upon a target apparatus having a target transaction master which initiates memory transactions with one or more target transaction slaves.

Description

It is known to provide data processing systems, such as system-on-chip integrated circuits, including a transaction master which initiates memory transactions with one or more transaction slaves. For example, the transaction master may be a general purpose processor, a graphics processing unit, a DMA unit or the like, and the transaction slaves may be a memory, an input/output unit, a display driver or the like. Such systems are increasingly complex and an important practical issues in their design and development is the ability to perform diagnostic operations upon the target apparatus to identify problems in the circuit design and/or programming. In order to support such diagnostic operations the target apparatus may be provided with diagnostic circuitry, such as serial scan chains, a trace unit, a breakpoint unit and the like. However, the provision of such diagnostic circuitry in the target apparatus has a cost and accordingly the capabilities of the diagnostic circuitry may be traded against the overhead associated with its provision. Thus, a low cost, low complexity, low pin count target device may have limited diagnostic capabilities which may make diagnosing problems with its design or programming more difficult.

SUMMARY

Viewed from one aspect the present disclosure provides a method of performing diagnostic operations upon a target apparatus having a target transaction master to initiate memory transactions with one or more target transaction slaves, said method comprising the steps of:

halting operation of said target transaction master while permitting continued operation within said target apparatus of at least some of said one or more target transaction slaves;

transferring opening state data representing an operating state of said target transaction master from said target transaction master to a model transaction master;

emulating further operation of said target transaction master with said model transaction master using said opening state data; and performing said diagnostic operations upon said model transaction master; wherein when said model transaction master emulates initiation of a memory transaction with a memory address mapped to one of said one or more target transaction slaves, initiating said memory transaction within said target apparatus.

Viewed from another aspect the present disclosure provides diagnostic apparatus for performing diagnostic operations upon a target apparatus having a target transaction master to initiate memory transactions with one or more target transaction slaves, said diagnostic apparatus comprising circuitry to:

halt operation of said target transaction master while permitting continued operation within said target apparatus of at least some of said one or more target transaction slaves;

transfer opening state data representing an operating state of said target transaction master from said target transaction master to a model transaction master;

emulate further operation of said target transaction master with said model transaction master using said opening state data; and perform said diagnostic operations upon said model transaction master; wherein said diagnostic apparatus comprises circuitry to initiate a memory transaction within said target apparatus when said model transaction master emulates initiation of said memory transaction with a memory address mapped to one of said one or more target transaction slaves.

The above, and other objects, features and advantages of this disclosure will be apparent from the following detailed description of illustrative embodiments which is to be read in connection with the accompanying drawings.

EMBODIMENTS

Figure 1:
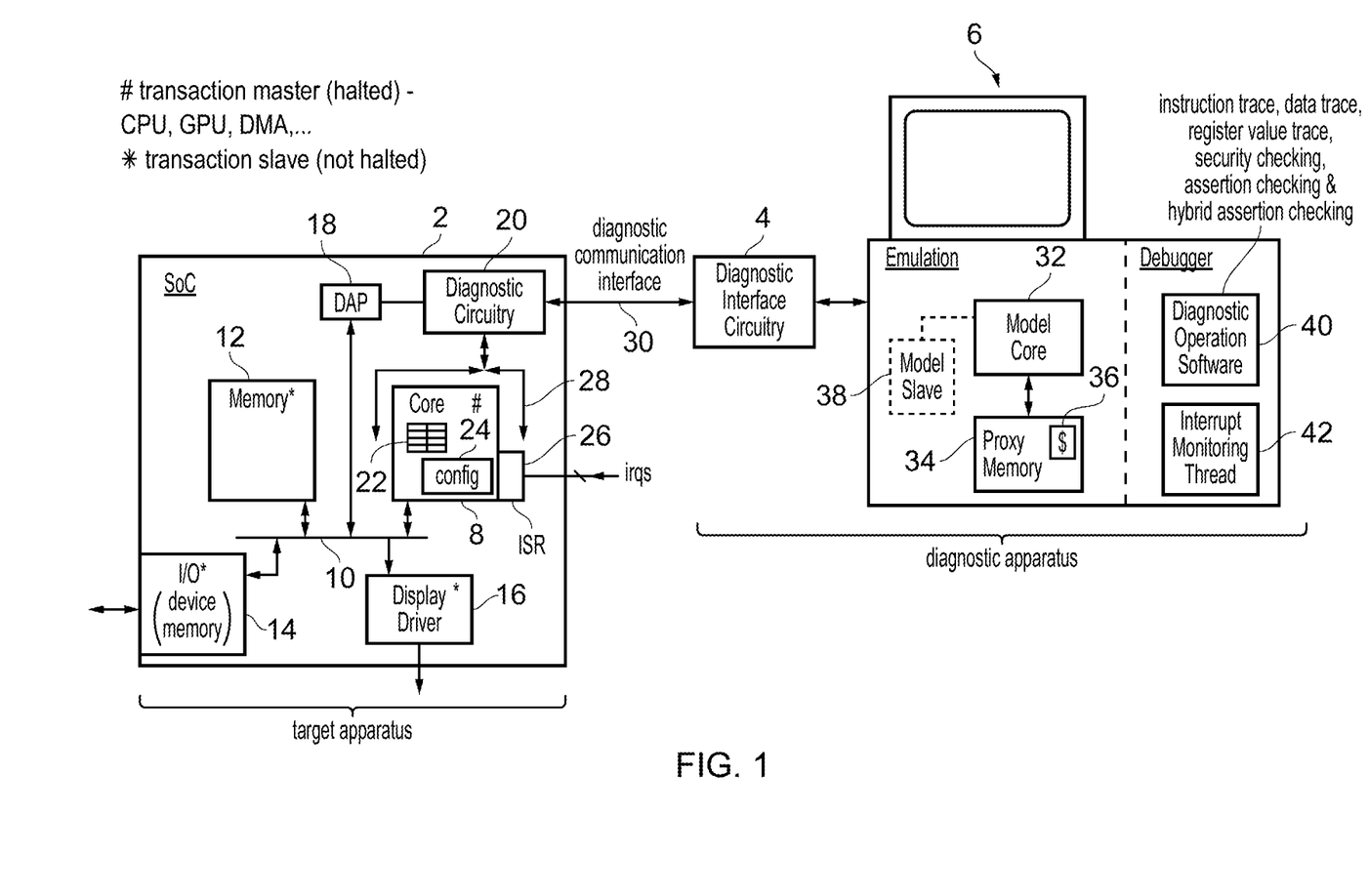
FIG. 1 schematically illustrates a target apparatus coupled to a diagnostic apparatus.

FIG. 1 schematically illustrates a target apparatus 2 coupled via diagnostic interface circuitry 4 to a general purpose processor 6 running software which provides an emulation of part of the target apparatus 2 and debugger software for performing diagnostic operations upon the target apparatus 2. The diagnostic interface circuitry 4 and the general purpose computer 6 controlled by emulation and debugger software together form a diagnostic apparatus.

In this example embodiment the target apparatus 2 has the form of a system-on-chip integrated circuit including a general purpose processor core 8 that serves as a transaction master which generates memory transactions upon an interconnect 10 to a plurality of transaction slaves including a memory 12, input/output circuitry 14, and a display driver 16. The memory transactions can have the form of memory reads or memory writes which are initiated by the general purpose processor core 8. Such master and slave transaction models for memory operations will be familiar to those in this technical field. It will be appreciated that the general purpose processor 8 is only one example of a transaction master which may be present within the target apparatus 2. Other examples include a graphics processing unit or a direct memory access DMA unit. It is possible that a given target apparatus 2 may include a plurality of transaction masters of the same or differing types, e.g. the target apparatus may include multiple general purposes processor cores each capable of serving as a transaction master.

Also included within the target apparatus are a debug access port 18 coupled to the interconnect 10. The debug access port 18 is controlled using diagnostic circuitry 20 within the target apparatus 2 in order to initiate memory transactions via the interconnect 10 with transaction slaves 12, 14, 16 and transaction masters 8 coupled to the interconnect 10. The debug access port 18 serves as a transaction master.

The general purpose processor 8 in operation executes program instructions using processing registers 22 storing working data values to be manipulated. One or more configuration registers 24 store configuration values serving to control the configuration of the general purpose processor 8. At any given instant of time the contents of the processing registers 22 and the configuration registers 24 represent at least part of the operating state of the general purposes processor 8. Such a snapshot of the operating state may be transferred to another instance of the processing core having the same architecture, or a software model of the processing core concerned, in order to place that other instance into a matching operating state such that the other instance could continue the processing operations of the general purpose processor 8 in substantially the same manner as if those processing operations had been performed by the general purpose processor 8 itself. The general purpose processor 8 is coupled to an interrupt status register 26 which is responsive to received interrupt signals (irqs) to store interrupt flag values indicative of whether or not particular interrupt signals have been received. As will be understood by those in this technical field, when an interrupt signal is received, this triggers a redirection of program flow to an interrupt serving routine (following an interrupt vector) selected in dependence upon which interrupt signal has been received. Such interrupt driven processing is common within real-time processing systems.

The diagnostic circuitry 20 is coupled to core debug logic 28 which may, for example, serve to capture data values from the general purpose processor 8 and inject data values into the general purposes processor 8 during diagnostic (debug) operations. The core debug logic 28 may be accessed via, for example, serial scan chains directly, or via serial scan chains acting on the debug access port 18 (which then accesses the core debug logic 18 via memory mapped debug registers). The use of core debug logic 28 for diagnostic purposes and for capturing state data is an established technique and typically uses a relatively narrow diagnostic communication interface 30 requiring relatively few external connections from the target apparatus 2. In the present context, the core debug logic 28 operating under control of the diagnostic circuitry 20 may be used to capture data values representing the contents of the processing registers 22 and the configuration registers 24 representing an operating state of the general purpose processor 8 at any given time such that such state data may be passed out of the target apparatus 2 and used to initialise a software model of the general purpose processor 8. In a similar manner, when it is desired to resume processing by the general purposes processor 8 the operating state of a software model may be transferred back to the general purpose processor 8 via the core debug logic 28.

The diagnostic circuitry 20 may serve to halt the processing operation of the general purpose processor 8 by placing it into a debug state. One consequence of entering the debug state is that the processor clock to the general purpose processor 8 is stopped such that it no longer executes further instructions while the operating state data values up to that point in the processing are maintained. Other portions of the target apparatus 2, such as the transaction slaves 12, 14, 16, are permitted to continue their operation when the general purpose processor 8 is halted. Thus, some or all of the transaction slaves 12, 14, 16 may continue to be clocked and may continue to perform their intended processing operations, such as being responsive to input and output signals, and driving a display apparatus.

FIG. 1 additionally illustrates diagnostic apparatus in the form of diagnostic interface circuitry 4 coupled to the target apparatus 2 via a diagnostic communication interface 30, A general purpose computer 6 is coupled to the diagnostic interface circuitry 4. The diagnostic interface circuitry 4 supports communication between the diagnostic circuitry 20 on the target apparatus 2 and the general purpose computer 6 running diagnostic software and emulation software For example, the diagnostic communication interface 30 may use protocols such as those associated with serial scan chains whereas the communication between the diagnostic interface circuitry 4 and the general purpose computer 6 may use communications such as those associated with the internet TCP/IP or standard computer peripherals.

The general purpose computer 6 is illustrated as executing software performing two major roles. In particular, the general purpose computer 6 executes emulation software which provides an emulation of operation of the target transaction master (general purpose processor 8) of the target apparatus 2. This emulation is provided by the model core 32 in FIG. 1. The emulation software also provides a proxy memory 34 which receives memory accesses from the model core 32 in place of the memory address space within the target apparatus accessed by the general purpose processor 8. This proxy memory 34 also supports a local cache 36 for caching one or more pages of memory from within the memory address space of the target address space 2. It is possible in some embodiments that as well as halting operation of the target transaction master (general purpose processor 8) and emulating this within the general purpose computer 6, the emulation may also involve the stopping and emulation of one or more transaction slaves from within the target apparatus. Such emulated model slaves are illustrated by the dashed-line block 38 within FIG. 1.

In operation when it is desired to perform diagnostic operations upon the target transaction master of the target apparatus 2 which are unsupported natively within the target apparatus 2, then the present techniques serve to halt operation of the target transaction master 8 within the target apparatus 2. Thereafter, starting state data representing the operating state of the target transaction master 8 is captured via the core debug logic 28 from the target transaction master 8 and transferred to the general purpose computer 6 where it initialises the state of the model transaction master 32. The software running on the general purpose computer 6 then emulates further operations of the target transaction master 8 using the model transaction master 32 and the starting state data which was transferred to the model transaction master 32. During such emulation diagnostic operations may be performed upon the model transaction master 32 using diagnostic operation software 40 executed by the general purpose computer 6. Such diagnostic operations may include, for example, instruction trace, data trace, register value trace, security checking (e.g. checking the origin of different portions of data within the system to ensure that data originating in the secure environment is not inappropriately made available within the non-secure environment), assertion checking and hybrid assertion checking. Hybrid assertion checking serves to check for a combination of at least one condition arising during the continued operation of the target apparatus 2 and at least one condition arising in the emulation performed by the model transaction master 32.

When the model transaction master 32 emulates initiation of a memory transaction with a memory address mapped to one of the one or more target transaction slaves 12, 14, 16 which are still operating within the target apparatus 2, such a memory transaction is routed via the proxy memory 34, the diagnostic interface circuitry 4, the diagnostic circuitry 20 and the debug access port 18 to the real (physical) target transaction slave 12, 14, 16 within the target apparatus 2 which are continuing to operate. Thus, while the operation of the target transaction master 8 is emulated by the model transaction master 32, the operation of at least some of the target transaction slaves 12, 14, 16 continues in the physical target apparatus 2. The target transaction master 8 in the form of the general purpose processor 8 is present within the target apparatus 2 but is in a halted state with its functionality being provided by the model transaction master 32. In this way, the model transaction master 32 can continue to interact with the target transaction slaves 12, 14, 16 within the target apparatus in a manner which provides a more realistic representation of real operation and with relatively little additional overhead. The proxy memory 34 models the memory address space of the target apparatus 2 and is accessed by the model transaction master 32 in place of the memory address space of the target apparatus 2. The proxy memory 34 serves to forward accesses made by the model transaction master 32 to the target apparatus 2 via the diagnostic interface circuitry 4, the diagnostic circuitry 20 and the debug access port 18.

When it is desired to stop emulation of the target transaction master 8, then emulation of the operation of the target transaction master 8 by the model transaction master 32 is halted. Closing state data representing an operating state of the model transaction master 32 is then captured from the model transaction master 32 and transferred back to the target transaction master 8 via the diagnostic interface circuitry 2, the diagnostic circuitry 20 and the core debug logic 28. This closing state data may include, for example, data values stored into the processing registers 22 and the configuration registers 24.

As a way of improving the performance of the emulation of the model transaction master 32, the proxy memory 34 may serve to cache blocks of stored values from within the memory address space of the target apparatus. These values may represent working data to be manipulated and/or program instructions to be executed. When a memory access is made to a memory address within a block of memory addresses which have not been previously accessed, then the proxy memory 34 serves to check that the block of memory addresses concerned does not correspond to memory addresses which it is inappropriate to cache (e.g. addresses of memory mapped input/output devices, memory addresses with multiple observers within the target apparatus where coherency issues could arise, etc.) and, if it is appropriate to cache such memory addresses, then the block of stored values including the accessed stored value are copied from the target apparatus 2 into the general purpose computer 6 where they are stored within what can be considered to be a cache memory 36 forming part of the proxy memory 34. Thereafter more rapid access may be made to memory addresses within such cached blocks of memory addresses by the model transaction master 32. When emulation is halted any stored values which have been modified whilst they have been held within the cache 36 are written back into the corresponding memory address locations within the memory address space of the target apparatus 2

The general purpose processor 8 as previously discussed is responsive to interrupt signals represented by flag values within an interrupt status register 26 to perform interrupt processing. Such behaviour can be emulated on behalf of a model transaction master 32 using an interrupt modelling thread 42 executed by the general purpose computer 6. This interrupt modelling thread 42 serves to periodically poll the content of the interrupt status register 26 within the target apparatus 2 via the diagnostic interface circuitry 4, the diagnostic circuitry 20 and the core debug logic 28. When an interrupt signal is recorded as having been received (i.e. a corresponding flag value within the status register 26 is set), then this information is recovered using the interrupt monitoring thread 42 back to the general purpose computer 6 where it is used to initiate corresponding interrupt processing by the model transaction master 32.

The diagnostic operation software 40 provides a variety of different diagnostic capabilities as previously discussed. These diagnostic capabilities may include at least some capabilities which are not provided natively for the target transaction master 8 by the diagnostic circuitry present within the target apparatus 2. The present techniques allow such advanced diagnostic capabilities to be provided for certain processing functions or operations using an emulation of the target transaction master 8. For example, if it is known that a particular software function is giving rise to errors in the operation of the target apparatus 2, then breakpoints may be established at the beginning and end of that function which transfer the operations corresponding to that function to the model transaction master 32 when that function is being executed. Accordingly, more advanced diagnostic capabilities which may be useful in determining the nature of the problems with that function may be achieved. The breakpoints at the start and end of such a function correspond to an emulation starting breakpoint and an emulation stopping breakpoint.

Figure 2:
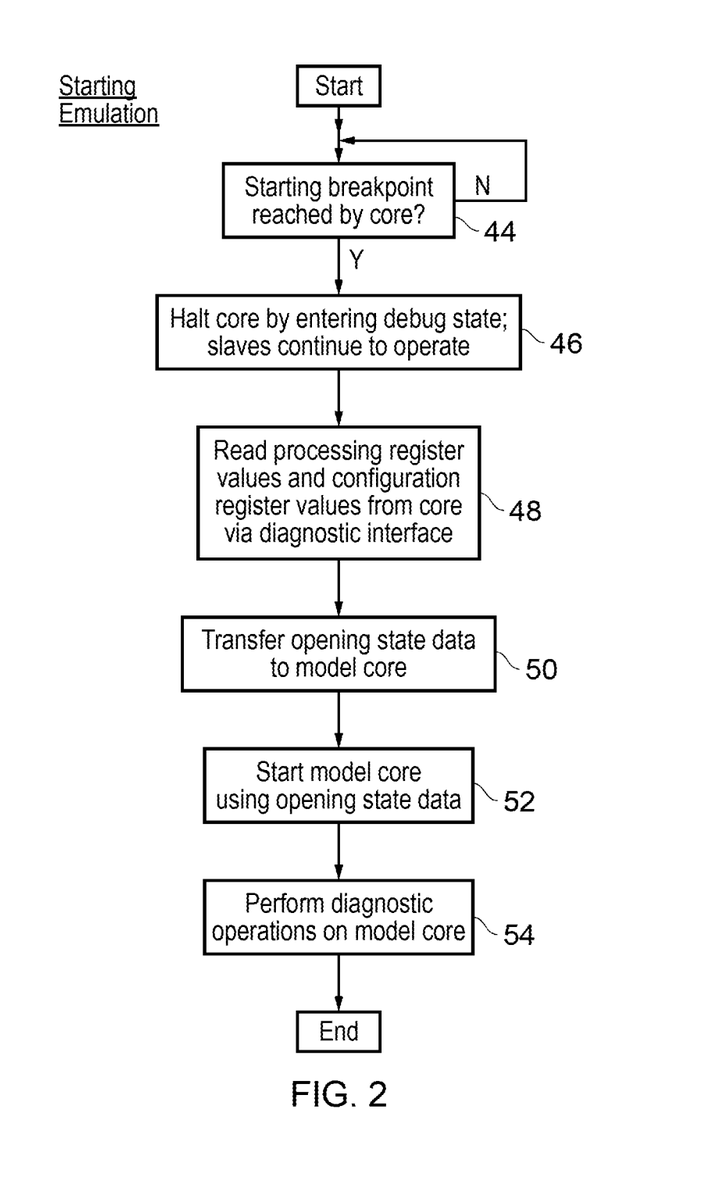
FIG. 2 is a flow diagram schematically illustrating the starting of emulation.

FIG. 2 is a flow diagram schematically illustrating the starting of emulation. At step 44 processing waits until a starting breakpoint is encountered in the processing performed by the general purpose processor 8. When such a starting breakpoint is encountered, then step 46 serves to halt operation of the target transaction master 8 by placing it in to a debug state (which includes stopping its clock) while at least some of the target transaction slaves 12, 14, 16 continue to operate. Step 48 serves to read the processing registers values and the configuration register values from the target transaction master 8 via the diagnostic interface circuitry 4. Such register values constitute at least part of opening state data which can be used to initiate continued processing by the model transaction master 32 carrying on from the starting breakpoint which was encountered. Step 50 serves to transfer this opening state data to the model transaction master 32. Step 52 then serves to start processing by the model transaction master 32 using the opening state data. Step 54 performs desired diagnostic operations upon the model transaction master 32 including, for example, some diagnostic operations which are not possible to perform using the diagnostic capabilities natively provided by the target apparatus 2.

Figure 3:
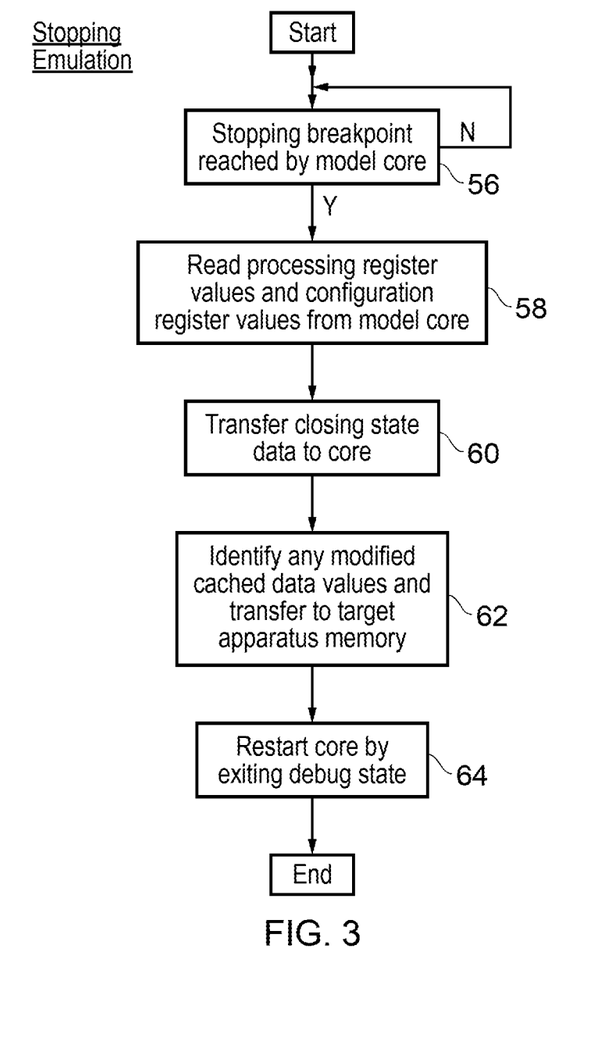
FIG. 3 is a flow diagram schematically illustrating the stopping of emulation.

FIG. 3 is a flow diagram schematically illustrating the stopping of emulation. Processing by the model transaction master 32 continues until step 56 encounters a stopping breakpoint within the processing performed by the model transaction master 32. When such a stopping breakpoint is encountered, step 58 serves to read processing register values and configuration register values from the model transaction master 32. Such processing register values and configuration register values constitute at least part of closing state data which is transferred using step 60 back to the target transaction master 8 via the diagnostic interface circuitry 4, the diagnostic circuitry 20 and the core debug logic 28. Step 62 serves to identify any modified cached data values held within the caches 36 of the proxy memory 34 and transfer these back into the corresponding memory address locations within the target apparatus 6. Step 64 then restarts processing by the target transaction master 28, such as by exiting this from debug stage (e.g. including restarting its clock).

Figure 4:
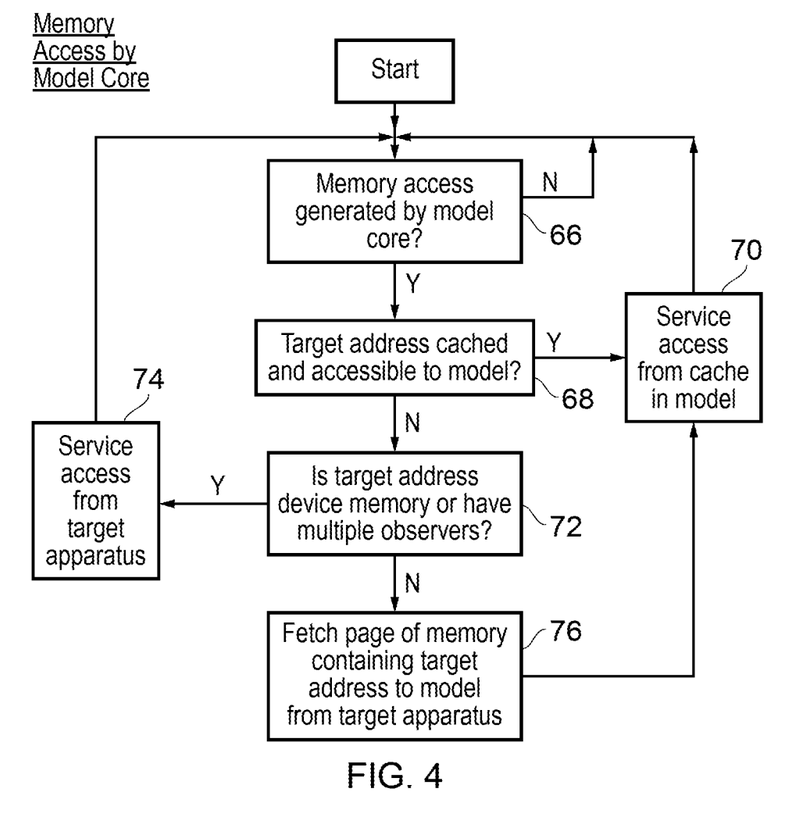
FIG. 4 is a flow diagram schematically illustrating memory access by a model core.

FIG. 4 is a flow diagram schematically illustrating a memory access by the model transaction master. Processing waits at step 66 until a memory access is generated by the model transaction master 32. Step 68 then determines whether the target address of the generated memory access is one which is already cached within a cache 36 of the proxy memory 34. If the target address is already cached, then the memory access is serviced at step 70 from the cache 36.

If the determination at step 68 is that the target address is not already cached, then step 72 determines whether the target address is one which is suitable for caching (e.g. is not one which is mapped to device memory or to a memory location which has multiple observers and accordingly potential coherency issues. If the target address is not suitable for caching, then the access is serviced at step 74 from the target apparatus 2 by forwarding the memory access via the diagnostic interface circuitry 4, the diagnostic circuitry 20 and the debug access port 18 onto the interconnect 10 and then to the appropriate transaction slave 12, 14, 16. If the target address is one that is suitable for caching, then processing proceeds from step 72 to step 76 where the page of memory containing the target address is fetched to the model from the target apparatus 2 via the diagnostic interface circuitry 4, the diagnostic circuitry 20 and the debug access port 18. The page size may be controlled by memory management unit page table data of the memory address space within the target apparatus 2 or may be configured in some other way, such as a fixed size set within the emulation software. It will be appreciated that the values cached within the caches 36 of the emulation may include both working data values and instruction values.

Figure 5:
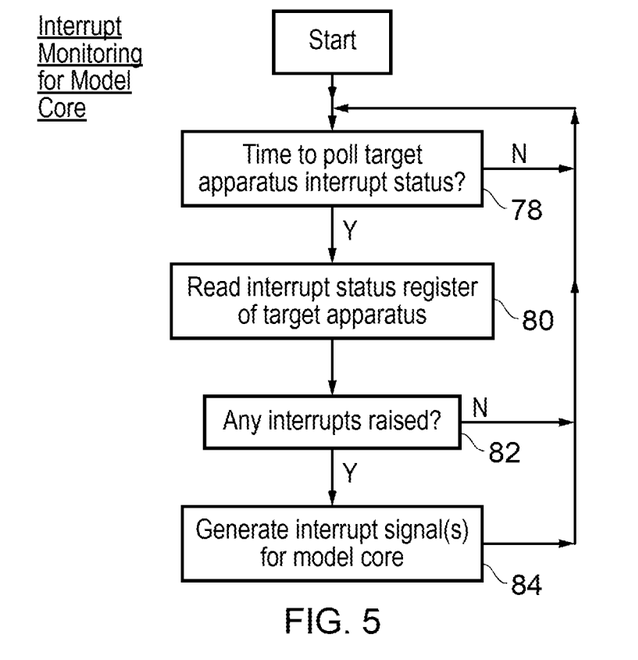
FIG. 5 is a flow diagram schematically illustrating interrupt monitoring for a model core.

FIG. 5 is a flow diagram schematically illustrating interrupt monitoring performed by the interrupt monitoring thread 42 on behalf of the model transaction master 32. Processing waits at step 78 until a periodic time arrives for polling the interrupt status register 26 within the target apparatus 2. When it is time to perform such a polling operation, processing proceeds to step 80 at which the contents of the interrupt status register 26 are read via the serial scan chain 28, the diagnostic circuitry 20 and the diagnostic interface circuitry 4 back to the general purpose computer 6. Step 82 serves to examine the contents of the read interrupt status register 26 to identify if any interrupts have been raised within the physical target apparatus 2 since the last polling operation took place. If any such interrupts have been raised, then processing proceeds to step 84 at which interrupt signals to the model transaction master 32 corresponding to the real physical interrupt signals are generated and then trigger appropriate interrupt processing by the model transaction master 32.

Figure 6:
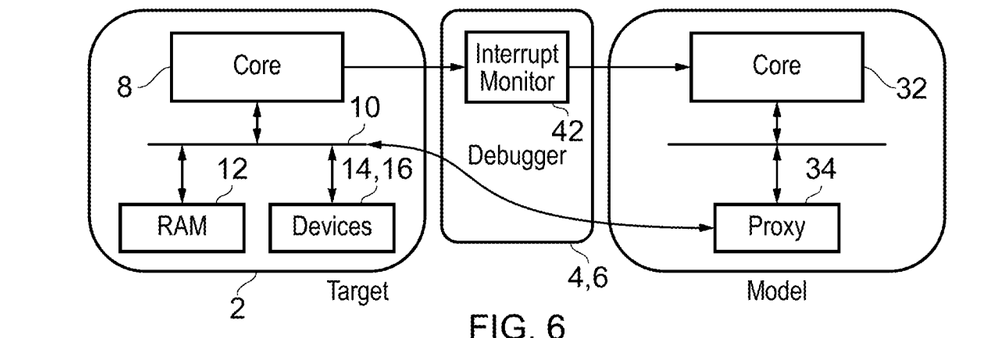
FIG. 6 schematically illustrates a target apparatus coupled via diagnostic interface circuitry to a software model of a target transaction master.

FIG. 6 schematically illustrates an alternative representation of the system of FIG. 1. Like reference numerals have been used. FIG. 6 illustrates how the model transaction master 32 communicates with the proxy memory 34 as if this were the real memory address space of the target apparatus 2. The proxy memory 34 is responsible for routing such memory accesses via the diagnostic interface circuitry 4 to the interconnect 10 and then the appropriate target transaction slaves 12, 14, 16 of the target apparatus 2. The proxy memory 34 also may perform caching of pages as previously discussed in order to improve the emulation performance. Interrupt signals received at the target transaction master 8 are forwarded via the interrupt monitor 42 to the model transaction master 32 to trigger interrupt processing responsive to real world physical interrupt signals irqs received by the model transaction master 32.

Figure 7:
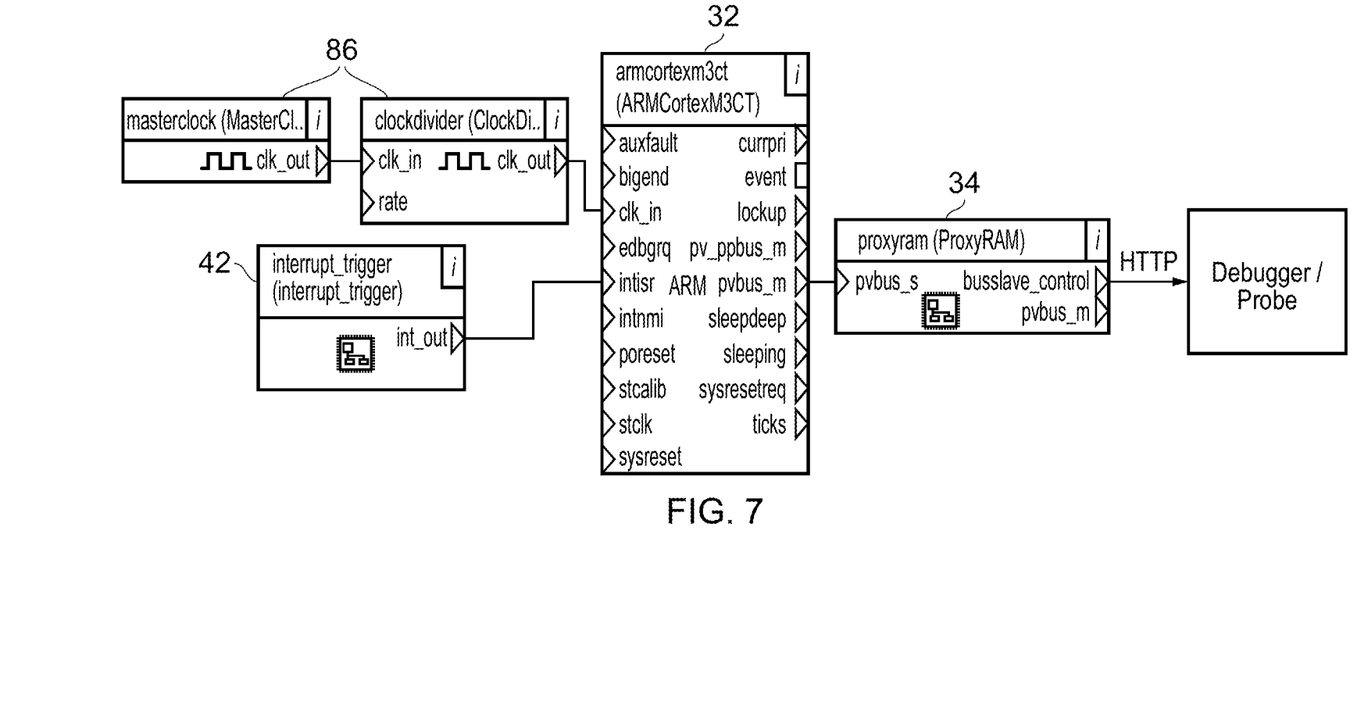
FIG. 7 schematically illustrates a plurality of software objects supporting the software emulation of a target transaction master.

FIG. 7 schematically illustrates a plurality of software objects used in the emulation performed by the general purpose computer 6. These objects include a transaction master model 32, an interrupt monitoring thread 42, clock generating objects 86 and the proxy memory 34. The emulation may be performed using emulation software structured in the form of object oriented code such as illustrated in FIG. 7, but other forms of emulation software are also possible.

Figure 8:
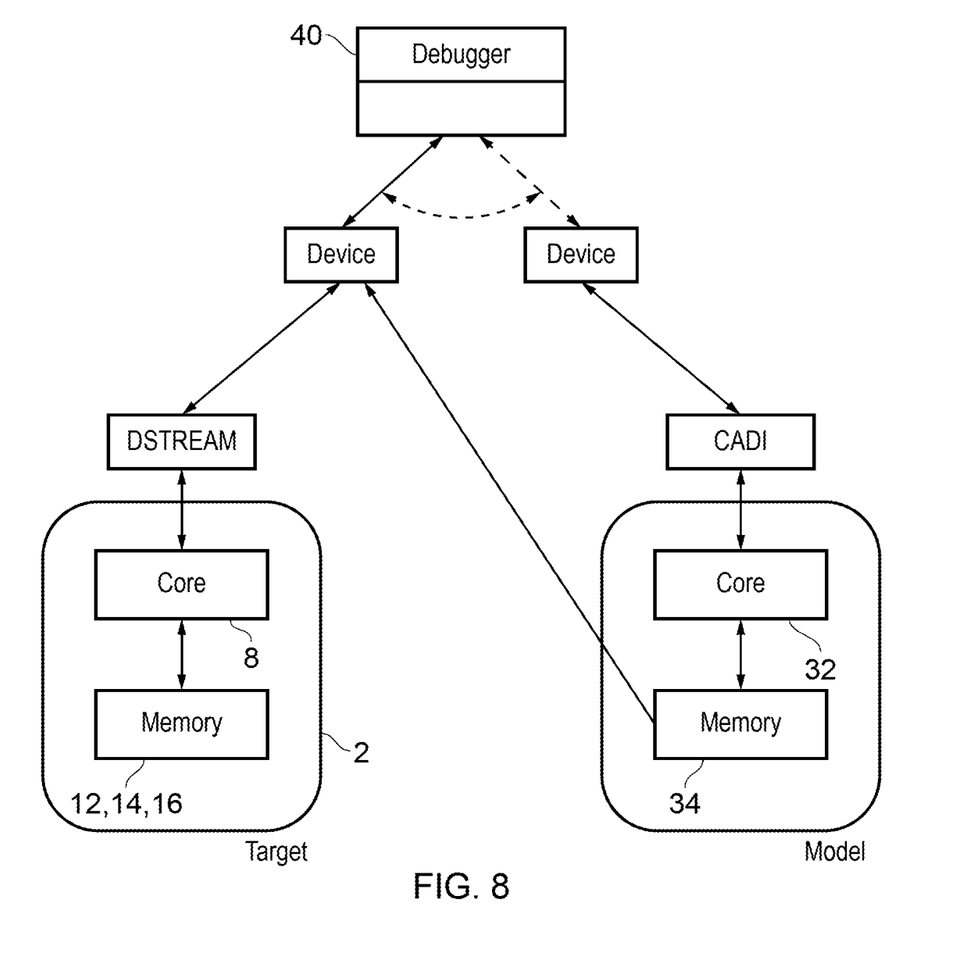
FIG. 8 schematically illustrates communication pathways between a target apparatus and a model transaction master.

FIG. 8 schematically illustrates communication between the target apparatus 2 and the emulation provided by the general purpose computer 6. Such communication is primarily routed via the diagnostic operation software. The proxy memory 34 serves to respond to memory accesses via the model transaction master 32 to directly either service these from cached values or forward the memory transactions to the physical target apparatus 2.

Although illustrative embodiments have been described in detail herein with reference to the accompanying drawings, it is to be understood that the claims are not limited to those precise embodiments, and that various changes, additions and modifications can be effected therein by one skilled in the art without departing from the scope and spirit of the appended claims. For example, various combinations of the features of the dependent claims could be made with the features of the independent claims.

We claim:

1. A method of performing diagnostic operations upon a target apparatus having a target transaction master to initiate memory transactions with one or more target transaction slaves, said method comprising the steps of:

halting operation of said target transaction master while operation within said target apparatus of at least one of said one or more target transaction slaves continues;

transferring opening state data representing an operating state of said target transaction master from said target transaction master to a model transaction master;

emulating further operation of said target transaction master with said model transaction master using said opening state data; and performing said diagnostic operations upon said model transaction master; wherein when said model transaction master emulates initiation of a memory transaction with a memory address mapped to one of said one or more target transaction slaves, initiating said memory transaction within said target apparatus.

2. A method as claimed in claim 1, comprising providing a proxy memory modelling a memory address space of said target apparatus and accessed by said model transaction master in place of said memory address space of said target apparatus, and forwarding accesses made by said model transaction master to said target apparatus.

3. A method as claimed in claim 1, comprising
halting emulation of said further operation with said model transaction master;
transferring closing state data representing an operating state of said model transaction master from said model transaction master to said target transaction master; and
restarting operation of said target transaction master using said closing state data.

4. A method as claimed in claim 3, comprising monitoring operation of said model transaction master to detect reaching of an emulation stopping breakpoint, and triggering said halting of further operation of said model transaction master when said emulation stopping breakpoint is reached.

5. A method as claimed in claim 1, comprising returning results of said memory transaction from said target apparatus to said model transaction master.

6. A method as claimed in claim 1, wherein when said memory address is within a block of memory addresses of a memory within said target apparatus storing stored values, said memory transaction triggers reading of a block of said stored values from said target apparatus and caching of said block of said stored values outside of said target apparatus as a block of cached stored values accessible to said model transaction master.

7. A method as claimed in claim 6, comprising
halting emulation of said further operation with said model transaction master;
transferring closing state data representing an operating state of said model transaction master from said model transaction master to said target transaction master; and
restarting operation of said target transaction master using said closing state data, wherein
any data values modified by said model transaction master within said cached stored values are written back to said memory prior to said restarting.

8. A method as claimed in claim 1, wherein when said memory address corresponds to one of:
a memory mapped device within said target apparatus; and
a memory address accessed by a plurality of devices, and each memory transaction to said memory address accesses said target apparatus.

9. A method as claimed in claim 1, comprising:
monitoring said target apparatus to detect occurrence of an interrupt signal to interrupt operation of said target transaction master; and
when occurrence of an interrupt signal is detected, generating a corresponding interrupt signal to trigger interrupt processing by said model transaction master.

10. A method as claimed in claim 9, wherein said monitoring comprises reading an interrupt status register within said target apparatus using an interrupt monitoring program thread executed by a diagnostic apparatus coupled to said target apparatus.

11. A method as claimed in claim 1, wherein said model transaction master is a software implemented model transaction master.

12. A method as claimed in claim 1, wherein said model transaction master provides diagnostic capabilities not provided by said target transaction master.

13. A method as claimed in claim 12, wherein said diagnostic capabilities comprise one or more of:
instruction trace;
data trace;
register value trace;
security checking;
assertion checking; and
hybrid assertion checking to check for a combination of at least one condition arising in said target apparatus and at least one condition arising in said model transaction master.

14. A method as claimed in claim 1, comprising monitoring operation of said target transaction master to detect reaching of an emulation starting breakpoint, and triggering said halting of operation of said target transaction master when said emulation starting breakpoint is reached.

15. A method as claimed in claim 1, wherein said memory transaction is communicated between said model transaction master and said target apparatus via a diagnostic communication interface.

16. A method as claimed in claim 15, wherein said diagnostic communication interface uses serial scan chains to capture data from said target apparatus and to transfer data to said target apparatus.

17. A method as claimed in claim 1, wherein said target transaction master is one of:
a programmable general purpose processor;
a graphics processing unit; and
a direct memory access unit.

18. A method as claimed in claim 1, comprising when said target transaction master is emulated by said model transaction master also emulating one or more of said target transaction slaves.

19. A method as claimed in claim 1, wherein said opening state data comprises at least processing register values and configuration register values of said target transaction master.

20. Diagnostic apparatus for performing diagnostic operations upon a target apparatus having a target transaction master to initiate memory transactions with one or more target transaction slaves, said diagnostic apparatus comprising circuitry to:
halt operation of said target transaction master while operation within said target apparatus of at least one of said one or more target transaction slaves continues;
transfer opening state data representing an operating state of said target transaction master from said target transaction master to a model transaction master;
emulate further operation of said target transaction master with said model transaction master using said opening state data; and
perform said diagnostic operations upon said model transaction master; wherein
said diagnostic apparatus comprises circuitry to initiate a memory transaction within said target apparatus when said model transaction master emulates initiation of said memory transaction with a memory address mapped to one of said one or more target transaction slaves.

* * * * *